United States Patent
von Malm et al.

(10) Patent No.: US 9,705,058 B2
(45) Date of Patent: Jul. 11, 2017

(54) METHOD FOR PRODUCING A PLURALITY OF OPTOELECTRONIC SEMICONDUCTOR CHIPS, AND OPTOELECTRONIC SEMICONDUCTOR CHIP

(71) Applicant: OSRAM Opto Semiconductors GmbH, Regensburg (DE)

(72) Inventors: Norwin von Malm, Nittendorf (DE); Andreas Plößl, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/893,922

(22) PCT Filed: May 28, 2014

(86) PCT No.: PCT/EP2014/061136
§ 371 (c)(1),
(2) Date: Nov. 24, 2015

(87) PCT Pub. No.: WO2014/191497
PCT Pub. Date: Dec. 4, 2014

(65) Prior Publication Data
US 2016/0111615 A1 Apr. 21, 2016

(30) Foreign Application Priority Data

May 29, 2013 (DE) .......................... 10 2013 105 550
Aug. 28, 2013 (DE) .......................... 10 2013 109 316

(51) Int. Cl.
*H01L 33/00* (2010.01)
*H01L 33/62* (2010.01)
(Continued)

(52) U.S. Cl.
CPC ........ *H01L 33/62* (2013.01); *H01L 27/14618* (2013.01); *H01L 27/14629* (2013.01);
(Continued)

(58) Field of Classification Search
None
See application file for complete search history.

(56) References Cited

U.S. PATENT DOCUMENTS

| 7,598,529 B2 | 10/2009 | Ploessl et al. |
| 8,039,860 B2 | 10/2011 | Moon et al. |

(Continued)

FOREIGN PATENT DOCUMENTS

| DE | 102007019776 A1 | 10/2008 |
| DE | 102007062046 A1 | 6/2009 |

(Continued)

OTHER PUBLICATIONS

Fan, "Wafer Level System Packaging and Integration for Solid State Lighting (SSL)," 2012 13th International Conference on Thermal Mechanical and Multi-Physics Simulation and Experiments in Microelectronics and Microsystems (EuroSimE), Apr. 16-18, 2012, 6 pages.

(Continued)

*Primary Examiner* — Shaun Campbell
(74) *Attorney, Agent, or Firm* — Slater Matsil, LLP (57) ABSTRACT

An optoelectronic semiconductor chip includes a semiconductor body that has a semiconductor layer sequence and at least one opening that extends through a second semiconductor layer into a first semiconductor layer. The chip also includes a support, which includes at least one recess, and a metallic connecting layer between the semiconductor body and the support. The metallic connecting layer includes a first region and a second region. The first region is connected to the first semiconductor layer in an electrically conductive manner through the opening and the second region is connected to the second semiconductor layer in an electrically conductive manner. A first contact is connected to the first region in an electrically conductive manner through the (Continued)

recess or a second contact is connected to the second region in an electrically conductive manner through the recess.

17 Claims, 7 Drawing Sheets

(51) Int. Cl.
*H01L 33/38* (2010.01)
*H01L 27/146* (2006.01)
*H01L 33/48* (2010.01)
*H01L 33/60* (2010.01)

(52) U.S. Cl.
CPC .. *H01L 27/14632* (2013.01); *H01L 27/14636* (2013.01); *H01L 27/14687* (2013.01); *H01L 33/382* (2013.01); *H01L 33/483* (2013.01); *H01L 33/60* (2013.01); *H01L 2933/0016* (2013.01); *H01L 2933/0066* (2013.01)

(56) References Cited

U.S. PATENT DOCUMENTS

| | | |
|---|---|---|
| 8,367,438 B2 | 2/2013 | Plöβl |
| 8,476,644 B2 | 7/2013 | Illek et al. |
| 8,482,026 B2 | 7/2013 | Höppel |
| 9,076,941 B2 | 7/2015 | Herrmann et al. |
| 9,171,995 B2 | 10/2015 | Yeh |
| 9,263,655 B2 | 2/2016 | Hoeppel |
| 9,293,675 B2 | 3/2016 | Yang et al. |
| 2011/0198646 A1 | 8/2011 | Wu et al. |
| 2012/0007101 A1* | 1/2012 | Yang ............... H01L 33/387 257/76 |
| 2012/0074441 A1 | 3/2012 | Seo et al. |
| 2012/0098025 A1* | 4/2012 | Hoppel ............... H01L 33/486 257/99 |
| 2013/0187192 A1 | 7/2013 | Hoeppel |
| 2013/0248918 A1* | 9/2013 | Miyachi ............. H01L 23/4824 257/99 |
| 2013/0299867 A1 | 11/2013 | Illek et al. |

FOREIGN PATENT DOCUMENTS

| | | |
|---|---|---|
| DE | 102009032486 A1 | 1/2011 |
| DE | 102010025320 A1 | 12/2011 |
| DE | 102010048159 A1 | 4/2012 |
| DE | 102011013821 A1 | 9/2012 |
| EP | 2405491 A2 | 1/2012 |
| EP | 2533313 A2 | 12/2012 |
| JP | 2011138839 A | 7/2011 |
| JP | 2011142231 A | 7/2011 |
| JP | 2011166150 A | 8/2011 |
| JP | 2012019217 A | 1/2012 |
| JP | 2012248833 A | 12/2012 |
| WO | 2012000725 A1 | 1/2012 |

OTHER PUBLICATIONS

Kojima, A., et al., "A Fully Integrated Novel Wafer-Level LED Package (WL2P) Technology for Extremely Low-cost Solid State Lighting Devices," 2012 IEEE International Interconnect Technology Conference (IITC), Jun. 4-6, 2012, 3 pages.

* cited by examiner

METHOD FOR PRODUCING A PLURALITY OF OPTOELECTRONIC SEMICONDUCTOR CHIPS, AND OPTOELECTRONIC SEMICONDUCTOR CHIP

This patent application is a national phase filing under section 371 of PCT/EP2014/061136, filed May 28, 2014, which claims the priority of German patent application 10 2013 105 550.8, filed May 29, 2013 and German patent application 10 2013 109 316.7, filed Aug. 28, 2013, each of which is incorporated herein by reference in its entirety.

TECHNICAL FIELD

The present application relates to a method for producing optoelectronic semiconductor chips and to an optoelectronic semiconductor chip.

BACKGROUND

Light-emitting diode semiconductor chips often have an electrical connection on the front side for electrical contacting, the connection being electrically contacted via a wire bond connection. However, such a wire bond connection makes it difficult to design the LED housing in a compact manner and also constitutes an additional risk of failure.

SUMMARY

Embodiments of the invention provide a method for producing an optoelectronic semiconductor chip, by means of which semiconductor chips can be produced in a simple and cost-effective manner, the chips being characterized by good optoelectronic properties. In embodiments, an optoelectronic semiconductor chip is provided which is characterized by a high efficiency.

In one embodiment, the method for producing a multiplicity of optoelectronic semiconductor chips comprises the following method steps:

a) depositing, on a growth substrate, a semiconductor layer sequence having an active region provided for generating and/or receiving radiation, the active region being arranged between a first semiconductor layer and a second semiconductor layer;

b) forming a multiplicity of openings that extend through the second semiconductor layer and the active region and into the first semiconductor layer;

c) providing a support;

d) attaching the semiconductor layer sequence to the support by producing a metallic connecting layer that connects the semiconductor layer sequence and the support at least in regions;

e) forming a multiplicity of recesses in the support;

f) forming a multiplicity of first contacts and a multiplicity of second contacts, wherein each of the first contacts is connected to the first semiconductor layer in an electrically conductive manner via one of a multiplicity of first regions of the metallic connecting layer and through at least one of the openings, and each of the second contacts is connected to the second semiconductor layer in an electrically conductive manner via one of a multiplicity of second regions, electrically insulated from the first regions, of the metallic connecting layer, and wherein the first contacts are connected to the first regions in an electrically conductive manner through the recesses or the second contacts are connected to the second regions in an electrically conductive manner through the recesses. More precisely, each of the first contacts is connected to one of the first regions in an electrically conductive manner through at least one of the recesses. Alternatively, each of the second contacts is connected to one of the second regions in an electrically conductive manner through one of the recesses; and g) singularizing the support having the semiconductor layer sequence into the multiplicity of optoelectronic semiconductor chips, wherein each semiconductor chip comprises at least one opening, at least one recess, at least one first region and at least one second region.

In this manner, optoelectronic semiconductor chips are provided, the two contacts of which are arranged on the surface of the produced component facing away from the emission side.

The fact that a layer or an element is arranged or applied "on" or "over" another layer or another element may here and hereinafter mean that the one layer or the one element is arranged in direct mechanical and/or electrical contact with the other layer or the other element. It may moreover also mean that the one layer or the one element is arranged indirectly on or over the other layer or the other element. In this case, further layers and/or elements may then be arranged between the one layer and the other layer.

By virtue of the fact that the recesses are formed only after attaching the semiconductor layer sequence to the support by producing a metallic connecting layer, only a relative low adjustment effort is required in order to align the elements, that are to be connected, with respect to each other. It is essential that the provision of a completely unstructured support, that is to say a support that in particular has no lateral structuring on one of its major surfaces, is sufficient for performing the method in accordance with the invention. A lateral direction is understood in particular to mean a direction in parallel with a main extension plane of the support and/or the semiconductor layer sequence, in particular the first or second semiconductor layer. For example, a commercially available silicon wafer can be used as the support.

The semiconductor layer sequence is efficiently attached to the support in a wafer composite and by use of a metallic connecting technique, in particular soft-soldering and isothermal solidification, the tolerance of which to unevenness and roughness is high and overcomes any requirement for a separate planarization step.

Owing to the delay in forming recesses in the support, connecting techniques can also be used at higher temperatures. This would not be possible if the support had already been provided with the recesses prior to being connected to the semiconductor layer sequence because owing to the inhomogeneous thermal expansion behavior of the different sub-structures, reliable adjustment would be impeded.

It is also advantageous in the method in accordance with the invention that, after attaching the semiconductor layer sequence to the support, the growth substrate is used as a mechanical stabilizer, whilst the recesses are being incorporated in the support that may have been thinned.

Method steps a) to c) can be performed in parallel or one after the other. Subsequently, method steps d) to h) are performed in the claimed sequence.

According to at least one embodiment, prior to attaching the semiconductor layer sequence to the support, a first metallic partial layer is formed on the side of the semiconductor layer sequence facing away from the growth substrate. Furthermore, a second metallic partial layer is formed on a first major surface of the support. Then, when attaching the semiconductor layer sequence to the support, the metallic connecting layer is produced owing to the fact that the first metallic partial layer and the second partial layer are integrally bonded together, at least in regions, in particular by a soldering process.

According to at least one embodiment, the first metallic partial layer includes a multiplicity of first partial layer regions and a multiplicity of second partial layer regions electrically insulated from the first regions.

According to at least one embodiment, prior to forming the first and second contacts, parts of the metallic connecting layer are removed so that a multiplicity of first regions and a multiplicity of second regions electrically insulated from the first regions are produced. This means that the metallic connecting layer is divided into regions having different polarities that are accordingly connected to the different contacts in an electrically conductive manner. This separation is necessary because a metallic, and therefore electrically conductive, layer is used as the connecting layer between the semiconductor layer sequence and the support.

According to at least one embodiment, the recesses are formed in the support by means of an etching process. Likewise, the metallic connecting layer can be separated into mutually insulated regions using an etching process. According to at least one embodiment, prior to forming the first and second contacts, an insulating layer is applied that covers the lateral surfaces of the recesses and, at least in part, a second major surface of the support facing away from the semiconductor layer sequence. Preferably, the insulating layer extends into the regions between the first and second regions of the metallic connecting layer so that the insulation layer provides effective separation of the polarities on the plane of the contacts and the metallic connecting layer.

According to at least one embodiment, the support is thinned after being attached to the semiconductor layer sequence. In this manner, it is easier to form the multiplicity of recesses in the support in the subsequent method step. Preferably, the thinned support has a thickness between 50 µm and 500 µm, particularly preferably between 100 µm and 200 µm.

According to at least one embodiment, the growth substrate is removed so that a thin film semiconductor chip having the advantages known from the prior art is provided.

According to at least one embodiment, the optoelectronic semiconductor chip comprises a semiconductor body that has a semiconductor layer sequence having an active region provided to generate and/or receive radiation and arranged between a first semiconductor layer and a second semiconductor layer, and has at least one opening that extends through the second semiconductor layer and the active region and into the first semiconductor layer and is at least partially filled with electrically conductive material. Moreover, the semiconductor chip comprises a support having at least one recess and a metallic connecting layer between the semiconductor body and the support. Preferably, the metallic connecting layer is a layer that is not simply continuous. Furthermore, it is preferred that the metallic connecting layer comprises at least one element having a low melting point, i.e., an element from the group Bi, In, Sn, or a soft solder.

The metallic connecting layer comprises a first region and a second region electrically insulated from the first region. The first region is connected to the first semiconductor layer in an electrically conductive manner through the opening.

The second region is connected to the second semiconductor layer in an electrically conductive manner. Moreover, the optoelectronic semiconductor chip comprises a first contact and a second contact. The first contact is connected to the first region of the metallic connecting layer in an electrically conductive manner through the recess. Alternatively, the second contact is connected to the second region of the metallic connecting layer in an electrically conductive manner through the recess.

According to at least one embodiment, the first contact and the second contact are at least partially arranged on a second major surface of the support facing away from the semiconductor body.

According to at least one embodiment, the first contact is connected to the first region in an electrically conductive manner via the support. Alternatively, the second contact is connected to the second region of the metallic connecting layer in an electrically conductive manner via the support. This presumes that the support is electrically conductive. For example, the support can consist of or contain a doped semiconductor material. Preferably, the support directly adjoins, at least in regions, the first region and/or the second region of the metallic connecting layer. In this manner, current can flow over the boundary surface between the support and the first region and/or the second region of the metallic connecting layer.

According to at least one embodiment, the support comprises at least one first and at least one second recess. The first contact is connected to the first region of the metallic connecting layer in an electrically conductive manner through the first recess. Additionally, the second contact is connected to the second region of the metallic connecting layer in an electrically conductive manner through the second recess. Therefore, according to this embodiment, the two contacts are connected to the mutually electrically insulated partial regions of the metallic connecting layer, and thus to the different semiconductor layers via through vias through the support.

According to at least one embodiment, the support contains silicon, in particular doped silicon.

According to at least one embodiment, a reflective layer is arranged between the support and the semiconductor body. Preferably, the reflective layer is connected to the second region of the metallic connecting layer in an electrically conductive manner and thus also to the second semiconductor layer.

According to at least one embodiment, the opening extends through the reflective layer. Preferably, an insulation layer is arranged between the reflective layer and the first region of the metallic connecting layer. Furthermore, an annular insulation web can be arranged between the first region and the second region of the metallic connecting layer.

According to at least one embodiment, the optoelectronic semiconductor chip is formed so that it can be surface-mounted.

The production method described above is particularly suitable for producing the described semiconductor chip. Therefore, features described in conjunction with the method can also be applied to the semiconductor chip, and vice-versa.

BRIEF DESCRIPTION OF THE DRAWINGS

Further features, embodiments and developments will be apparent from the following description of the exemplified embodiments in conjunction with the figures.

In the figures.

Identical, similar components or components which act in an identical manner are provided with the same reference numerals in the figures.

The figures and the size ratios of the elements with respect to each other, as illustrated in the figures, are not to be considered as being to scale. On the contrary, individual elements, in particular layer thicknesses, can be illustrated exaggeratedly large to enable better illustration and/or for improved understanding.

DETAILED DESCRIPTION OF ILLUSTRATIVE EMBODIMENTS

Figure 1:
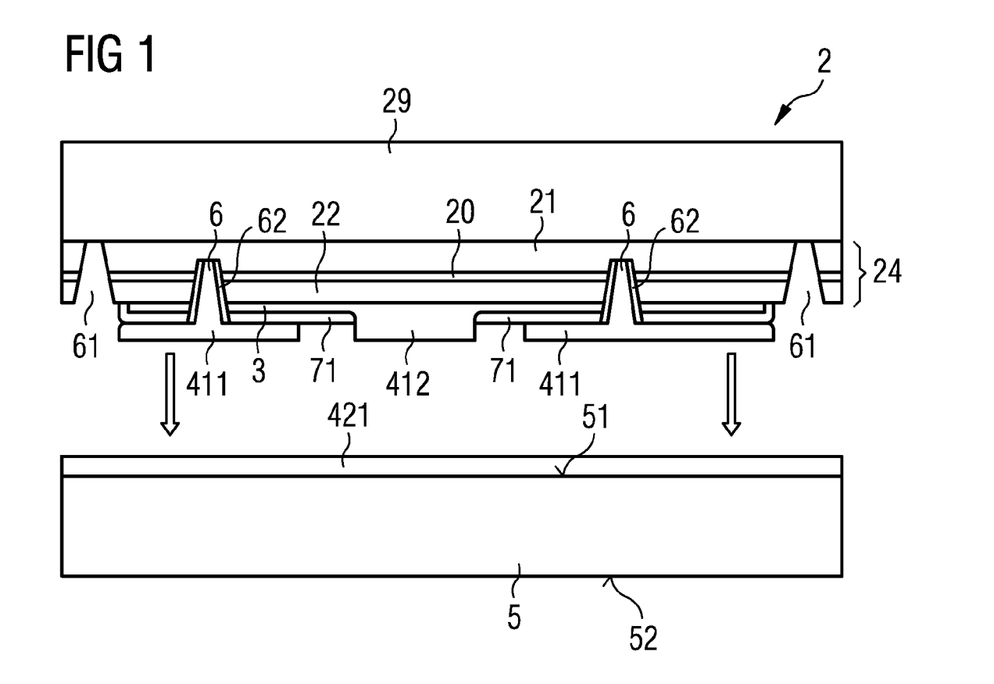
FIGS. 1 to 10 show a schematic sectional view of an exemplified embodiment for a method for producing optoelectronic semiconductor chips.

As shown in FIG. 1, initially a semiconductor body 2 and a support 5 are provided that are connected together to produce optoelectronic semiconductor chips.

The semiconductor body 2 comprises a growth substrate 29 on which a semiconductor layer sequence 24 is deposited, preferably epitaxially, e.g., by means of MOCVD. The semiconductor layer sequence 24 comprises a first semiconductor layer 21 facing the growth substrate 29, an active region 20 and a second semiconductor layer 22 on a side of the active region facing away from the first semiconductor layer 21. The type of conduction of the first semiconductor layer 21 and of the second semiconductor layer 22 are different from one another. For example, the first semiconductor layer 21 can be formed to be n-conductive and the second semiconductor layer can be formed to be p-conductive, or vice-versa. The first semiconductor layer 21 and the second semiconductor layer 22 can each comprise a plurality of partial layers.

For ease of illustration, the figures illustrate merely one section of a wafer composite, from which a semiconductor chip emanates during production. Furthermore, the production of a luminescent diode, for instance a light-emitting diode, is described merely by way of example. However, the method is also suitable for producing a laser diode or a radiation detector having an active region provided for receiving radiation.

The semiconductor layer sequence 24, in particular the active region 20, preferably contains a III-V compound semiconductor material that is gallium nitride in the present exemplified embodiment.

III-V compound semiconductor materials are particularly suitable for generating radiation in the ultraviolet spectral range ($Al_xIn_yGa_{1-x-y}N$) through the visible spectral range ($Al_xIn_yGa_{1-x-y}N$, in particular for blue to green radiation, or $Al_xIn_yGa_{1-x-y}P$, in particular for yellow to red radiation) to the infrared spectral range ($Al_xIn_yGa_{1-x-y}As$). In each case, $0 \leq x \leq 1$, $0 \leq y \leq 1$ and $x+y \leq 1$, in particular where $x \neq 1$, $y \neq 1$, $x \neq 0$ and/or $y \neq 0$. Furthermore, when generating radiation, high internal quantum efficiencies can be achieved using III-V compound semiconductor materials, in particular consisting of the material systems.

The active region 20 preferably comprises a pn-junction, a double heterostructure, a single quantum well structure (SQW) or, in a particularly preferred manner, a multiple quantum well structure (MQW) for generating radiation. The term quantum well structure contains no meaning as to the dimensionality of the quantization. It thus includes inter alia quantum troughs, quantum wires and quantum dots and any combination of these structures.

Sapphire, silicon carbide or silicon are, for example, suitable for epitaxially depositing, e.g., by means of MOCVD, MBE or LPE, a semiconductor layer sequence based on $Al_xIn_yGa_{1-x-y}N$ (nitride compound semiconductor material).

A reflective layer 3 is applied onto the semiconductor layer sequence 24, e.g., by means of vapor deposition or sputtering. The reflective layer preferably contains a metal or a metal alloy. For example, silver or a silver-containing alloy are characterized by a particularly high reflectivity in the visible spectral range. Alternatively, however, the reflective layer can also contain nickel, chromium, palladium, rhodium, aluminum, zinc or gold or can comprise a metal alloy having at least one of the metals. A gold-zinc alloy is, for example, suitable for the red to infrared spectral range.

In the present exemplified embodiment, the growth substrate 29 consists of sapphire.

An insulating layer 71 is arranged on a major surface of the reflective layer 3 facing away from the semiconductor layer sequence 24 and separates the reflective layer 3 into a multiplicity of first metallic partial layer regions 411. Second metallic partial layer regions 412 are arranged separated from the first metallic partial layer regions 411 by annular recesses 413 and are connected to the reflective layer 3 in an electrically conductive manner. The first metallic partial layer regions 411 and the second metallic partial layer regions 412 together form a first metallic partial layer 411, 412. A multiplicity of openings 6 extend from the first partial layer regions 411 through the insulating layer 71, the reflective layer 3, the second semiconductor layer 22 and the active region 20 into the first semiconductor layer 21. An anisotropic etching process, e.g., reactive ion etching, in particular reactive ion deep etching, is particularly suitable for forming openings having a high to extremely high aspect ratio. However, the aspect ratio of the depth of the opening 6 to the width thereof can also be selected to be smaller, for example, with a depth of 1 to 2 μm for a width of 20 to 40 μm. The insulating layer 71 can be, for example, a silicon dioxide layer that is deposited, for example, by means of a CVD process (chemical vapor deposition), for instance a PECVD process (plasma enhanced chemical vapor deposition).

The walls of the openings 6 are lined with an insulating material, preferably an insulating layer 62, that likewise contains silicon dioxide, for example. Furthermore, the openings 6 are at least partially filled with electrically conductive material, and so an electrically conductive connection is produced between the first partial layer regions 411 and the first semiconductor layer 21.

Expediently, the openings 6 are distributed over the extent of the semiconductor body 2. Preferably, they are distributed uniformly in a grid, e.g., in a lattice point-like manner. In that way, charge carriers can enter the first semiconductor layer 21 locally via the openings 6, distributed laterally over the semiconductor body 2. Expediently, the semiconductor material of the first semiconductor layer 21 has a higher conductivity in the lateral direction, i.e., in parallel with the active layer 20, than the material that is used for the second semiconductor layer 22. Despite the contacting of the first semiconductor layer 21 via the openings 6 only occurring in places, a homogeneous current distribution in the lateral direction can be achieved via current spreading in the semiconductor body 2. A large-area charge carrier injection into the active region 20 can thus be achieved despite the charge carrier injection only being local. In nitride compound semiconductor materials, n-conductive material often has a considerably higher conductivity in the lateral direction than p-conductive material, e.g., p-GaN. Therefore, the first semiconductor layer 21 is preferably formed to be n-conductive and the second semiconductor layer 22 is formed to be p-conductive. In the present exemplified embodiment, the first semiconductor layer 21 consists of n-GaN and the second semiconductor layer 22 consists of p-GaN.

Furthermore, the semiconductor body 2 comprises a multiplicity of additional openings 61 that are arranged in regions in which, during a subsequent method step, separation of the semiconductor body 2 is to occur, in order to achieve singularization into a multiplicity of optoelectronic semiconductor chips.

The first partial layer regions 411 and the second partial layer regions 412, that together form the first metallic partial layer 41, are preferably formed such that a boundary surface of the semiconductor body 2 facing away from the growth substrate 29 is produced that is as flat as possible and acts as a connecting surface for the subsequent production of the metallic connecting layer.

The first metallic partial layer 411, 412 can, in turn, be composed of one or more elementary layers.

In the present exemplified embodiment, the first metallic partial layer 411, 412 comprises a layer sequence that comprises a layer of tin as a solder layer that produces the subsequent integrally bonded connection to the second metallic partial layer. In order to protect the solder layer against oxidation, the layer sequence contains, on a side of the tin solder layer facing away from the semiconductor layer sequence 24, an oxidation protective layer that can be formed, for example, from gold. Furthermore, a barrier layer consisting of titanium can be arranged between the tin solder layer and the gold oxidation protective layer, the barrier layer being formed so as to reduce diffusion of a solder component into the oxidation protective layer.

More precisely, the first metallic partial layer 411, 412 comprises a layer sequence that has the following individual layers (as seen from the growth substrate 29 in the following sequence): a layer of tin (thickness, e.g., between 1.5 μm and 2.5 μm), a layer of titanium (thickness, e.g., between 5 nm and 20 nm) (optionally) arranged thereon, a layer of gold (thickness, e.g., between 50 nm and 200 nm) arranged thereon.

As illustrated in FIG. 1, a support 5 is furthermore provided, that is preferably unstructured, that is to say has no local structures. Silicon is particularly suitable for the support 5 owing to good microstructurability. However, another material, in particular another semiconductor material, such as, for example, germanium or gallium arsenide, can also be used. In the present exemplified embodiment, the support 5 is doped and is of the same type of conduction as the first semiconductor layer 21. A heavily doped, commercially available silicon wafer can be used, for example. For n-doped silicon, doping concentrations of greater than $5 \times 10^{17}$ cm$^{-3}$, corresponding to a specific resistance ρ of 0.03 Ωcm, are preferred, in the case of p-doped silicon, for similarly low specific resistances, somewhat higher dopant concentrations are preferred, e.g., of greater than $2 \times 10^{18}$ cm$^{-3}$, corresponding to a specific resistance ρ of 0.03 Ωcm.

Formed on a first major surface 51 of the support 5 is a second metallic partial layer 421 that in turn can consist of a individual metallic layer or a suitable layer sequence. Preferably, the second metallic partial layer 421 fulfills a plurality of tasks and acts as a contact between the metal and semiconductor, as a wetting layer that is formed to react with the solder layer provided by the first metallic partial layer 411, 412, and as a depletion layer that protects the electrical contact between the metal and semiconductor from the solder.

In the present exemplified embodiment, the different functions are performed by a layer of nickel.

More precisely, the second metallic partial layer 421 comprises a layer sequence that has the following individual layers (as seen from the support 5 in the following sequence): a layer of nickel (thickness, e.g., between 2 μm and 3 μm) and a thin layer of gold arranged thereon that protects the layer of nickel against oxidation.

Figure 2:
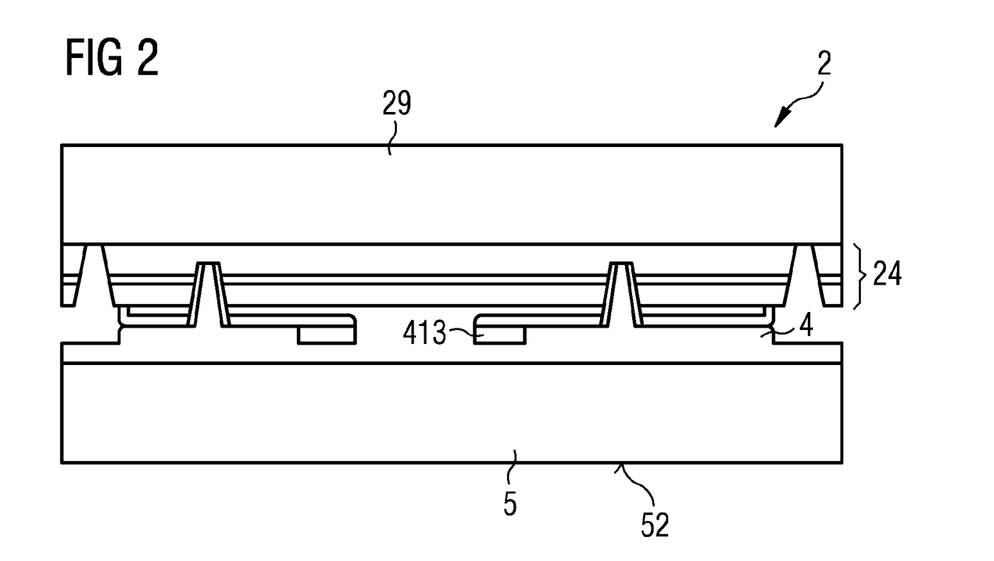

As illustrated in FIG. 2, the first metallic partial layer 411, 412 is integrally bonded to the second metallic partial layer 421 by a soldering process, whereby a metallic connecting layer 4 is produced that connects the semiconductor body 2 and the support 5. In this case, the semiconductor body 2 and the support 5 are held at a temperature between 200° and 300° C., preferably between 230° C. and 250° C. until a practically complete reaction between the tin and nickel has taken place and the alloy has solidified (isothermal solidification). Since the support 5 still does not have any structures, rough adjustment of the semiconductor body 2 with respect to the support 5 is sufficient and can be permitted in the connecting process by means of simple stop apparatuses. The temperatures used in the present case for the isothermal solidification are relatively low, and so the thermal contraction behavior of the growth substrate 29 (sapphire) and of the support 5 (silicon) are only slightly different, which means that damaging buckling of the structures does not occur.

After producing the metallic connection layer 4, the support can be thinned from a major surface 52 facing away from the semiconductor layer sequence 24 in order to reduce the thickness of the support 5. Thinning can be effected by means of a mechanical process, e.g., grinding, polishing or lapping, and/or by means of a chemical process. The thinning process causes the structural height of the produced semiconductor chip to be reduced. In addition, the thinning process simplifies the subsequent formation of recesses in the support. The growth substrate 29 provides mechanical stability that is required when the support 5 has been thinned.

Figure 3:
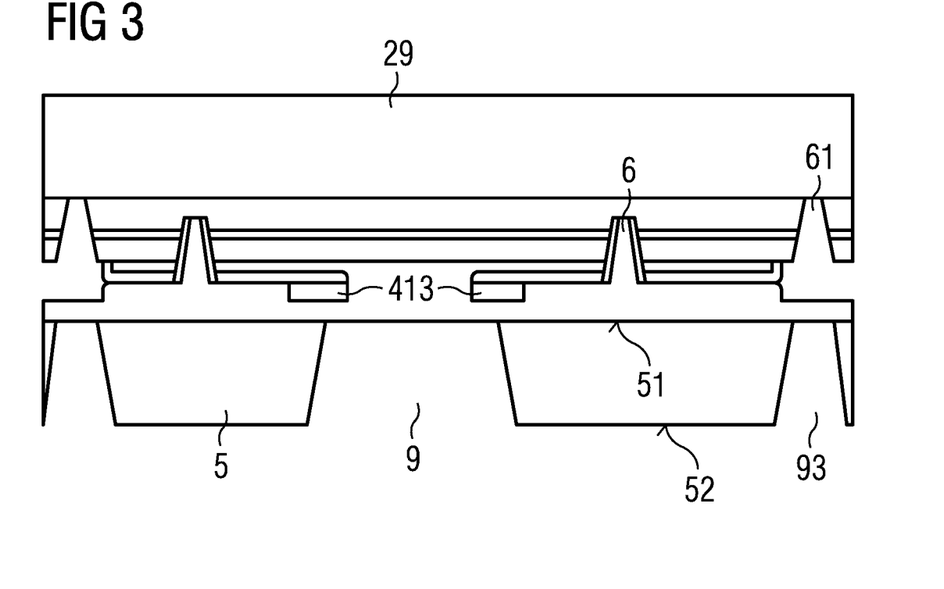

In the next method step illustrated in FIG. 3, recesses 9 are formed in the support 5 in the regions of the original second partial layer regions 412 and the annular recesses 413, the recesses 9 extending from the second major surface 52 to the first major surface 51 of the support 5. Preferably, prior to this method step, the regions for the recesses 9 are photolithographically defined, wherein in an advantageous manner a lithographic mask used for performing the photolithographic process can be oriented on structures that are externally visible from a side of the semiconductor layer sequence 24 facing the growth substrate 29 (from the top in FIG. 3). A diameter of the recesses 9 is preferably at least 2 μm, particularly preferably at least 10 μm, smaller than an outer diameter of the annular recesses 413.

The recesses 9 are formed in the support 5 by an etching process, whereby regions of the metallic connecting layer 4 are exposed that correspond to the subsequent second regions of the metallic connecting layer 4 and are connected to the second semiconductor layer 22 in an electrically conductive manner in the produced optoelectronic semiconductor chip. More precisely, the recesses 9 that have a diameter of between 10 μm and 200 μm, preferably between 25 μm and 50 μm, are etched in a dry-chemical and anisotropic manner until the etching process automatically comes to a stop in regions consisting of nickel, in which no reaction between nickel and tin takes place.

Figure 4:
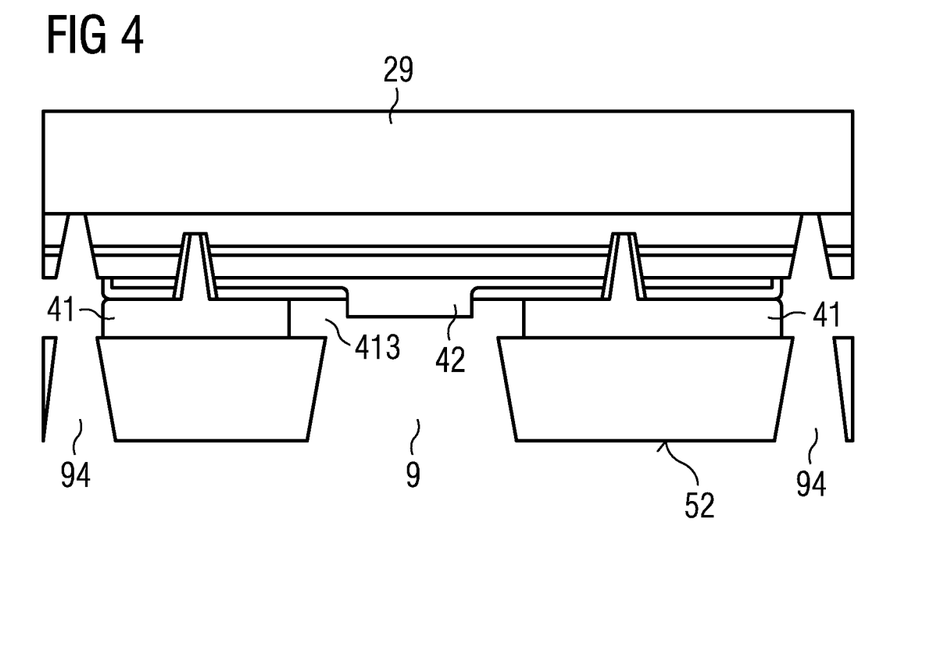

As illustrated in FIG. 4, in the next method step, parts of the metallic connecting layer 4 that adjoin the annular recesses 413 are removed. This occurs by virtue of the fact that the regions are etched in a wet-chemical manner, whereby partial regions containing nickel and gold are removed whilst the inter-metallic connection $Ni_3Sn_4$ is not affected. In this manner, a multiplicity of first regions 41 and a multiplicity of second regions 42 of the metallic connecting layer 4 are produced that are electrically insulated from one another and are connected to the first semiconductor layer 21 and the second semiconductor layer 22 respectively, in an electrically conductive manner.

The annular recesses 413 that separate the first regions from the second regions 42 are exposed by this step.

As illustrated in FIG. 3, in addition to the recesses 9, a multiplicity of additional recesses 93 are formed in the support 5 that are arranged in the region of the additional openings 61 and overlap same in plan view from a side facing away from the growth substrate 29. Parts of the metallic connecting layer 4 that are arranged between the additional openings 61 in the semiconductor layer sequence 24 and the additional recesses 93 are removed by the above-described etching process at the same time as the parts that adjoin the annular recesses 413, and so through-going channels 94 are formed that extend from the second major surface of the support 52 to the boundary surface between the semiconductor layer sequence 24 and the growth substrate 29.

Figure 5:
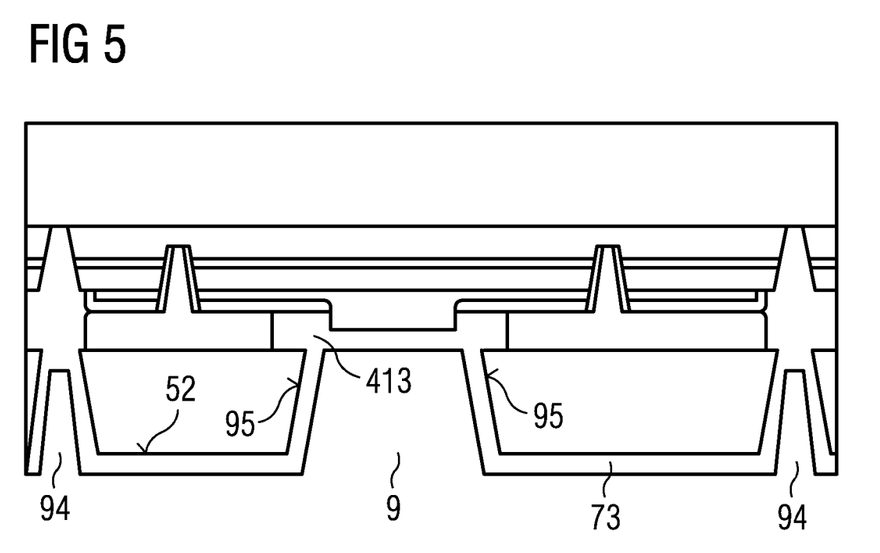

Subsequently, as illustrated in FIG. 5, an insulating layer 73 is applied that covers the lateral surfaces 95 of the recesses 9 and the second major surface 52 of the support 5. Moreover, the insulating layer 73 extends into the recesses 9 to the region of the metallic connecting layer 4, and so the annular recesses 413 are filled by the insulating layer 73. The first regions 41 and the second regions 42 of the metallic connecting layer 4 are electrically insulated from each other by the insulating layer 73.

Furthermore, the insulating layer 73 extends into the through-going channels 94 and thus forms a passivation layer for the mesa trenches defined by the through-going channels 94. By virtue of the fact that the additional openings 61 are formed in the semiconductor body 2 prior to connecting same to the support 5 (see FIG. 1), through-going channels 94 can be formed in the method provided herein, the channels providing mesa trenches with negative mesa flanks and being able to be covered by a passivation layer at the same time as the insulation of the first and second regions of the metallic connecting layer 4. In this manner, an additional method step for providing a passivation layer that covers the mesa trenches is not necessary.

The insulating layer 73 can contain or consist of, for example, silicon dioxide and/or silicon nitride ($Si_3N_4$). Preferably, a layer thickness of the insulating layer 73 is selected such that the annular recesses 413 are completely filled by the insulating layer 73. The insulating layer 73 can be deposited, for example, by means of a CVD process (chemical vapor deposition), for instance a PECVD process (plasma enhanced chemical vapor deposition). Alternatively, an ALD process (atomic layer deposition) can be used.

Figure 6:
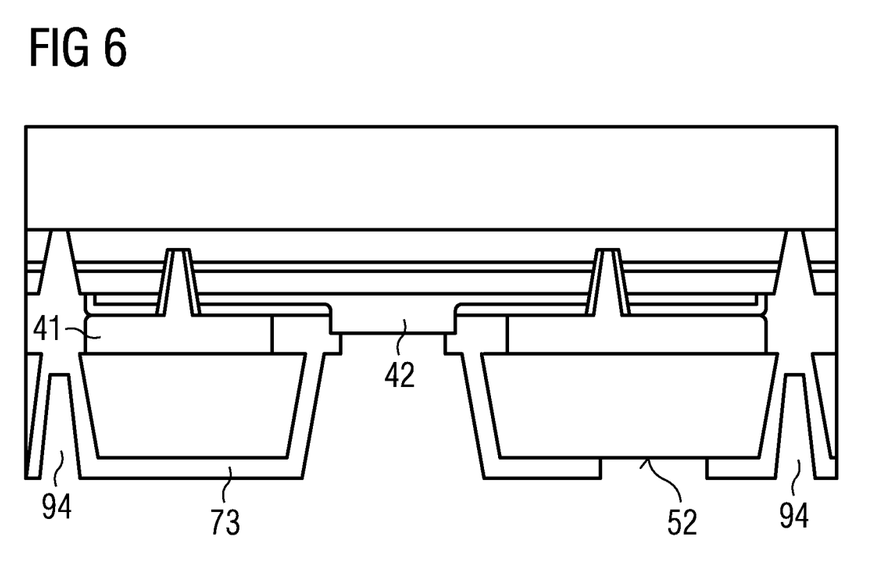

Subsequently, as illustrated in FIG. 6, the insulating layer 73 is removed at least in regions in order to expose, at least in regions, the second region 42 of the metallic connecting layer 4 and the second major surface of the support 52.

By virtue of the fact that the second regions 42 of the metallic connecting layer 4 have a smaller diameter than the recesses 9, that is to say the second regions 42 do not overlap the support 5 as seen from the side of the support 5, the second regions 42 of the connecting layer 4 no longer contribute, at least after forming the recesses 9, to an integral bond between the semiconductor body 2 and the support 5. Therefore, the metallic connecting layer 4 connects the semiconductor body 2 (or the semiconductor layer sequence 24) and the support 5 only in regions, in the present exemplified embodiment only by the first regions 41.

The insulating layer 73 is removed in regions by a photolithographical structuring that, in the region of the second regions 42 of the metallic connecting layer 4, exposes the layer of $Ni_3Sn_4$ arranged therein and, in the region of the second major side of the support 5, exposes silicon.

In an alternative embodiment, a self-adjusting process is selected, e.g., using the so-called spacer technique. In this case, side walls that are as vertical as possible are provided for the recesses 9 (and optionally simultaneously for the additional recesses 93). The insulating layer 73 is applied in two stages. Initially, in a coating step that is as conformable as possible, all the lateral surfaces together with the base in the recesses 9, 93 are coated uniformly. Then, in a targeted coating step, a second insulating layer is substantially applied on the second major surface 52 of the support 5, wherein the high aspect ratio prevents substantial coating of the base surfaces in the recesses 9, 93. The second insulating layer acts as a mask in a subsequent anisotropic etching process, the process mainly affecting surfaces in parallel with the major surfaces, and, in contrast, etching the surfaces inclined with respect thereto to a lesser extent. The protrusion, illustrated in FIG. 6, in the insulating layer 73 in the region of the second regions 42 of the metallic connecting layer is not formed in this process. The described method bypasses a complicated photolithographic exposure of the deep-lying connection surfaces. In contrast, the opening in the insulating layer 73 on the second major surface 52 of the support 5 can be effected in a conventional photolithography process.

Figure 7:
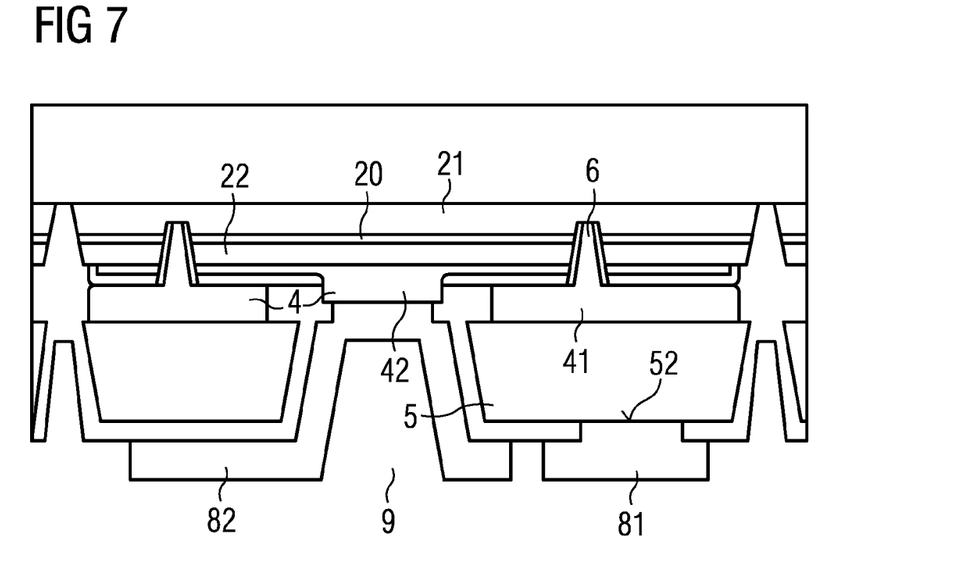

In the following method step illustrated in FIG. 7, a multiplicity of first contacts 81 and a multiplicity of second contacts 82 are formed. Each of the first contacts 81 is connected to the first semiconductor layer 21 in an electrically conductive manner via the conductive support 5 having one of the first regions 41 of the metallic connecting layer 4 and thus through at least one of the openings 6. The first contacts are arranged completely on the second major surface 52 of the support 5.

The second contacts 82 are arranged, at least in regions, on the second major surface 52 of the support 5. Moreover, they extend into the recesses 9 and adjoin the second regions 42 of the metallic connecting layer 4. Therefore, each of the second contacts 82 is connected to the second semiconductor layer 22 in an electrically conductive manner via one of the second regions 42 of the metallic connecting layer 4.

The first contacts 81 and the second contacts 82 are formed by virtue of the fact that a seed layer consisting of nickel and gold is deposited on the second major surface 52 of the support 5 and in the recesses 9 and, according to the definition of a photolithographic mask, the seed layer is electrochemically reinforced with copper in the windows of the mask. After removing the lithographic mask and the non-reinforced regions of the nickel/gold layer, the first contacts 81 and the second contacts 82 are completed.

Figure 8:
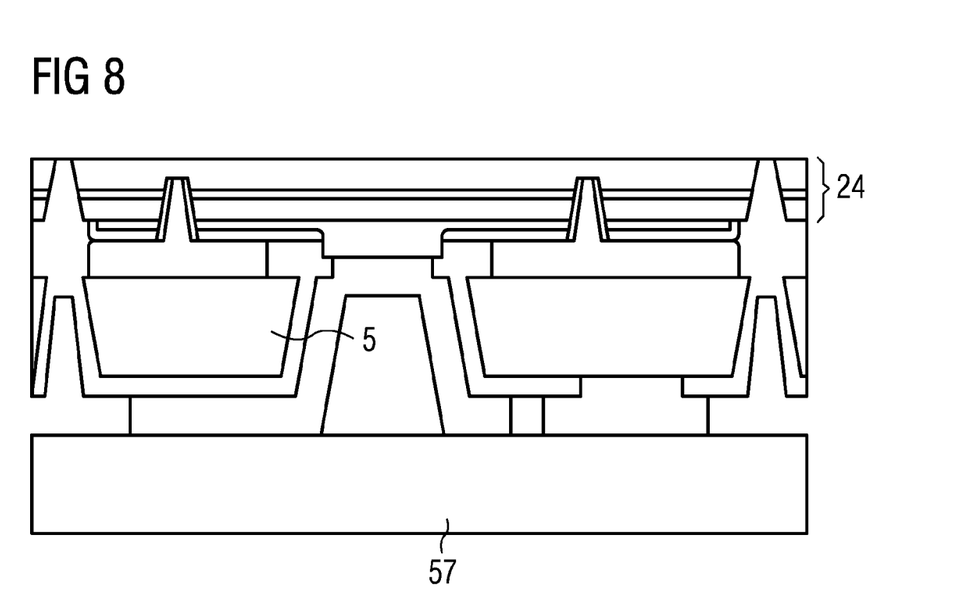

Then, as illustrated in FIG. 8, the growth substrate 29 is removed. In the present case, in which the growth substrate 29 consists of sapphire, a laser lift-off process (LLO) can be used that can generally be used in the case of radiolucent substrates. If, in contrast, the growth substrate 29 consists of silicon, for example, then a mechanical process, a chemical process or the combination of a mechanical process and a subsequent chemical process are particularly suitable for removing the growth substrate. Since the removal of the growth substrate 29 is associated with a loss of mechanical stability, the layer structure illustrated in FIG. 7 is applied onto a temporary support 57.

Figure 9:
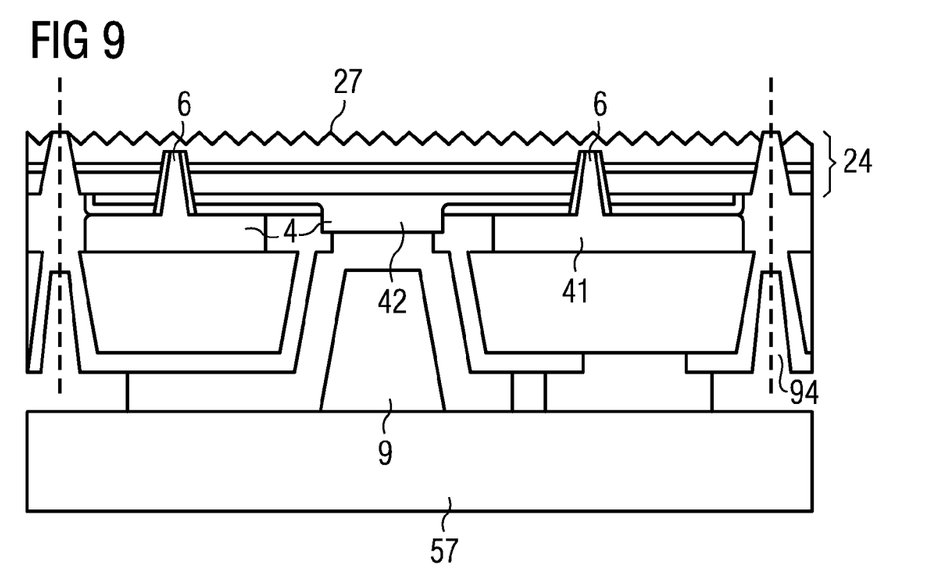

A radiation exit surface of the semiconductor layer sequence 24 facing away from the support 5 is provided with a structuring 27 (see FIG. 9). The structuring 27 can be used to increase the out-coupling efficiency for the radiation generated in the active region 20 during operation. The structuring can be formed in an irregular or regular manner, in particular periodically, for instance for forming a photonic grid. The layer structure shown in FIG. 9 is separated along the mesa trenches 94, whereby it is singularized into a multiplicity of optoelectronic semiconductor chips, wherein each individual semiconductor chip comprises two openings 6, a recess 9, a first region 41 and a second region 42 of the metallic connecting layer 4.

Figure 10:
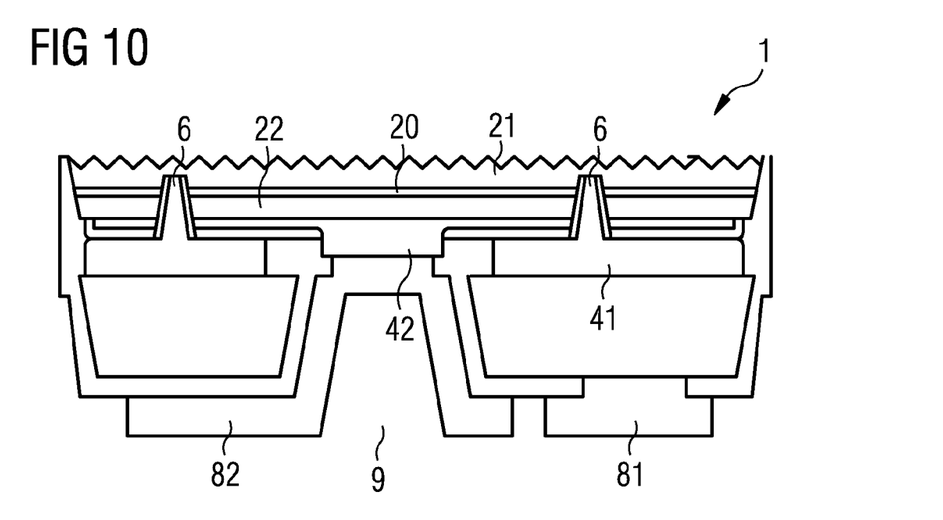

FIG. 10 illustrates a produced optoelectronic semiconductor chip 1 in accordance with the invention after removing the temporary support 57.

In FIGS. 5 to 9, the insulating layer 73 in the channels 94 covers the lateral surfaces to the boundary surface between the growth substrate 29 and the semiconductor layer sequence 24. In an exemplified embodiment that is not illustrated, the insulating layer 73 is formed thinner in the region. This has the consequence that in the method step in which the insulating layer is removed, in regions, in the region of the recess 9 (see FIG. 6), the insulating layer can also be simultaneously removed in the channels 94 in the region of the boundary surface between the growth substrate 29 and the semiconductor layer sequence 24. After removing the auxiliary support 57, already singularized devices are present. It is thus no longer necessary to separate the layer structure, shown in FIG. 9, along the mesa trenches 94.

Figure 11:
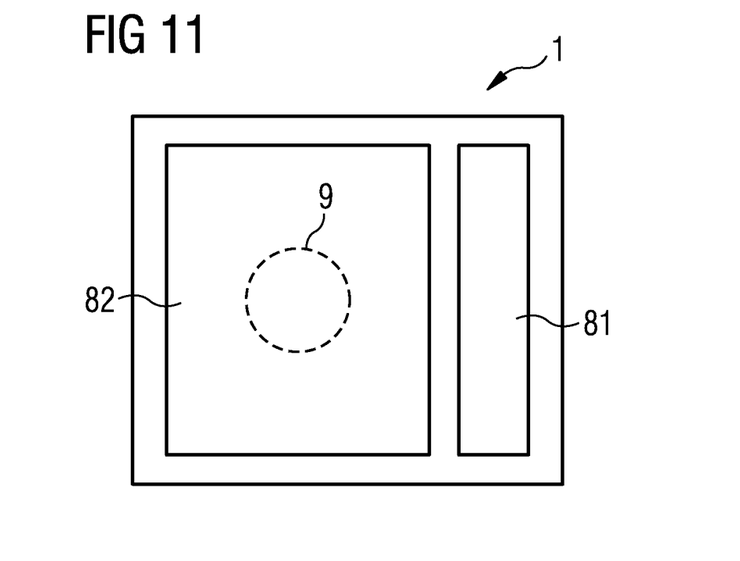
FIGS. 11 to 14 each show a rear view of a produced semiconductor chip according to different exemplified embodiments.

FIG. 11 illustrates a rear view of the semiconductor chip 1 shown in FIG. 10 in accordance with a first exemplified embodiment. The first contact 81 and the second contact 82 are arranged next to each other in the lateral direction. The electrical contacting of the semiconductor chip 1 can be effected, in the case of assembly in a housing or on a connection substrate, e.g., a printed circuit board, directly when producing the attachment in the housing or connection substrate. A wire bond connection for producing an electrical top side contact is also not necessary, whereby production costs and the demand for gold can be reduced. By applying an electrical voltage between the first contact 81 and the second contact 82, charge carriers can be injected from opposite directions in the active region 20 and can recombine there, with radiation being emitted. An electrical contact on the radiation exit surface of the semiconductor body 2 for electrically contacting the first semiconductor layer 21 is thus not required.

Figure 12:
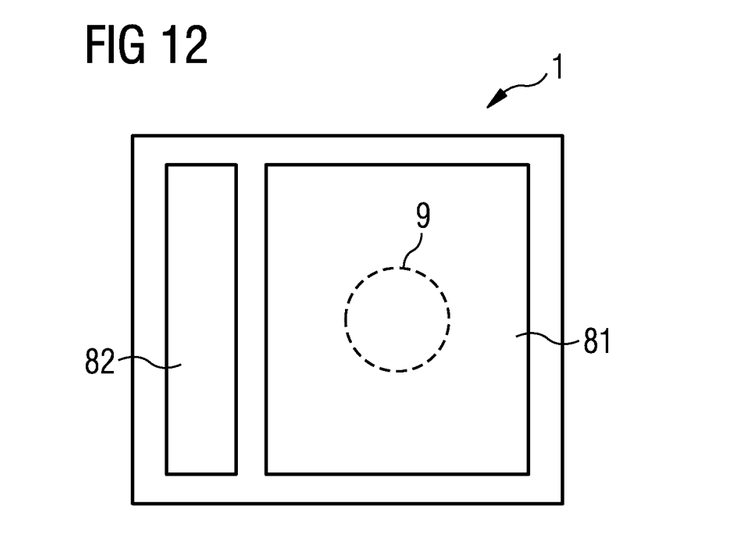
Figure 13:
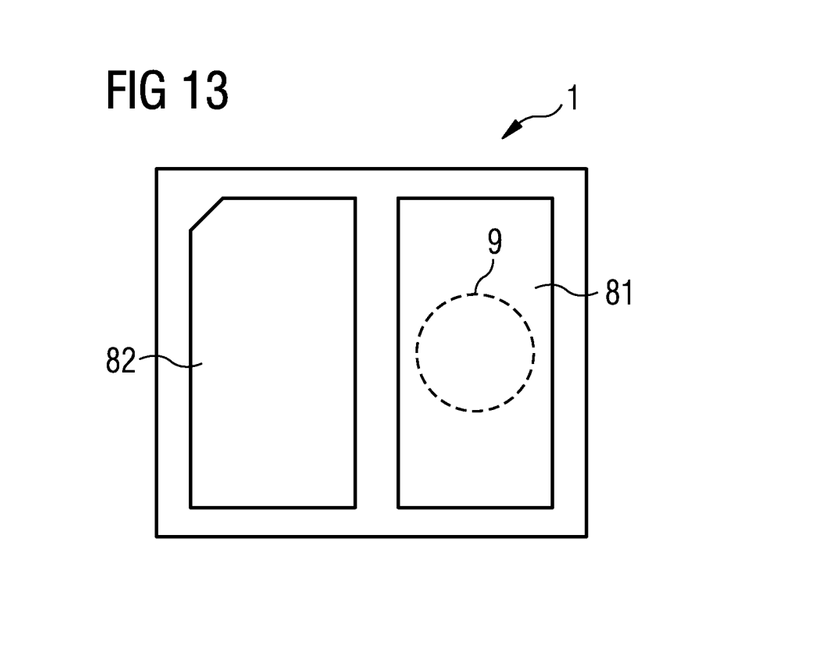
Figure 14:
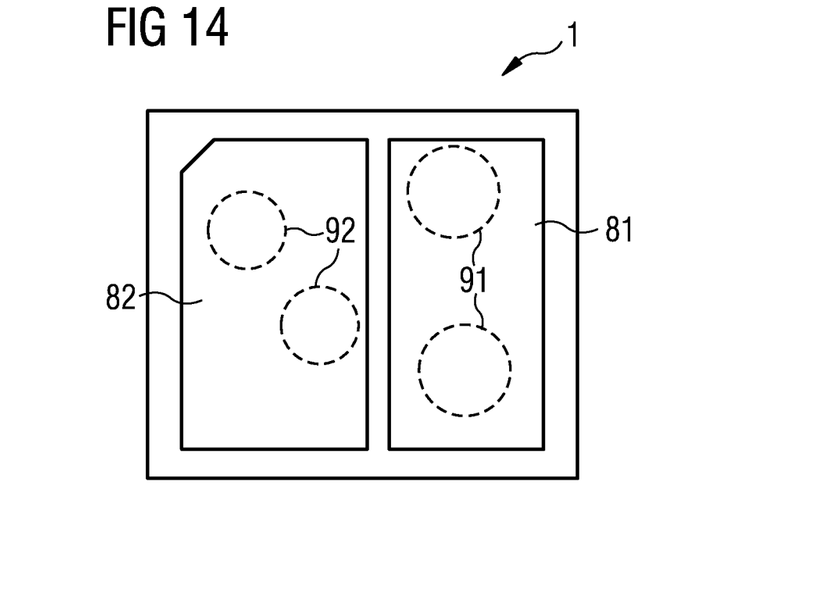

FIGS. 12 to 14 illustrate rear views of semiconductor chips 1 according to further exemplified embodiments.

FIG. 12 illustrates a rear view of a produced semiconductor chip according to an embodiment in which likewise only one recess 9 is provided, but in contrast to the first exemplified embodiment the recess 9 provides an electrically conductive connection between the first contact 81 and the first region 41 of the metallic connecting layer 4. In other words, the first contact 81 is connected to the first region 41 of the metallic connecting layer 4 in an electrically conductive manner through the recess 9 and thus is also connected to the first semiconductor layer 21 in an electrically conductive manner through the opening 6.

In the exemplified embodiment illustrated in FIG. 13, the first contact 81 and the second contact 82 are formed to be essentially the same size. The recess 9 is arranged eccentrically with respect to the first contact 81.

FIG. 14 illustrates an exemplified embodiment in which the support 5 comprises a plurality of first recesses 91 and a plurality of second recesses 92 and the first contact 81 is connected to the first region 41 of the metallic connecting layer 4 in an electrically conductive manner through the first recesses 91 and the second contact 82 is connected to the second region 42 of the metallic connecting layer 4 in an electrically conductive manner through the second recesses 92. In other words, in this case a through via is provided in the support 5 for both polarities and an electrically conductive connection through the support material is obviated. In this embodiment, it is advantageous that the support 5 can consist of an electrically insulating material.

On the whole, it is apparent from the rear views, shown in FIGS. 11 to 14, of the semiconductor chip 1 in accordance with the invention that the invention is not limited to a particular geometry in terms of the arrangement of the two contacts 81, 82 and the recesses 9, 91, 92. Preferably, a surface proportion, in plan view of a rear side of the semiconductor chip 1 in accordance with the invention, of the recesses 9, 91, 92 in relation to the main surface of the semiconductor chip 1 in accordance with the invention (or in relation to the overall surface of the contacts 81, 82) is $5*10^{-4}$ and $2*10^{-2}$ per polarity.

In a further exemplified embodiment (not additionally illustrated), like materials, or at least materials, the thermal expansion coefficients of which are extremely close to each other, are used for the growth substrate 29 and the support 5. For example, silicon can be used as the material for the growth substrate 29 and also for the support 5. This has the advantage that the above-described connection between the semiconductor sequence 24 and the support 5 through the metallic connecting layer 4 results in reduced stresses and resulting deformations of the structure at elevated temperature and with the subsequent cooling of the system. As a result, when using the same material for the growth substrate 29 and support 5, solder systems that react only at higher temperatures can be used to produce the metallic connecting layer 4.

For example, instead of the nickel-tin solder system used in the first exemplified embodiment, one consisting of gold and tin can be used. This solder system is characterized in that it forms a liquid phase during the reaction process for a longer period of time and thus parts of the liquid solder system can advantageously be pressed into the openings 6, whereby these are completely filled with an electrically conductive material. In this manner, the occurrence of cavities that adversely affect the electrically conductive connection between the first regions 41 of the metallic connecting layer 4 and the first semiconductor layer 21 is prevented.

In the present exemplified embodiment, the first metallic partial layer 411, 412 has a layer sequence that has a layer of tin as the solder layer that is thinner than in the first exemplified embodiment (thickness, e.g., between 0.4 μm and 0.6 μm), but is otherwise formed in the manner described for the first exemplified embodiment.

More precisely, the first metallic partial layer 411, 412 comprises a layer sequence that has the following individual layers (as seen from the growth substrate 29 in the following sequence): a layer of tin (thickness, e.g., between 0.4 μm and 0.6 μm), a layer of titanium (thickness, e.g., between 5 nm and 20 nm) (optionally) arranged thereon, and a layer of gold (thickness, e.g., between 50 nm and 200 nm) arranged thereon.

The second metallic partial layer 421 comprises a wetting layer consisting of gold, a depletion layer consisting of platinum, titanium and titanium tungsten nitride, and a contact consisting of aluminum between the metal and semiconductor.

More precisely, the second metallic partial layer 421 comprises a layer sequence that has the following individual layers (as seen from the support 5 in the following sequence): a layer of aluminum, a layer of tungsten nitride arranged thereon, a layer of titanium (thickness, e.g., between 60 nm and 80 nm) arranged thereon, a layer of platinum (thickness, e.g., between 230 nm and 270 nm) arranged thereon, and a layer of gold (thickness between 1.5 µm and 2.5 µm) arranged thereon.

Since hardly any differences in thermal expansion behavior of the structure occur by using silicon in the growth substrate 29 and the support 5, relatively high process temperatures can be used. In the present case, the metallic connecting layer 4 is produced by isothermal solidification at temperatures between 340° C. and 350° C. The system is kept at temperature until the tin has completely reacted with the gold and platinum and has constitutionally solidified.

Compared with the first exemplified embodiment described in conjunction with FIGS. 1 to 10, in the present example a less-doped material (silicon) is used for the support 5. In this manner, the support 5 has an improved thermal conductivity, and so it can be thinned to a larger thickness, e.g., between 140 µm and 160 µm.

In the present exemplified embodiment, the diameter of the recesses 9 is between 25 µm and 35 µm. When forming same, etching is performed in a dry-chemical and anisotropic manner in the silicon of the support 5 until the process comes to a stop in regions consisting of aluminum. Platinum and gold are then etched in a wet-chemical manner whilst the inter-metallic connection of platinum/gold and tin is not affected. As described above in relation to the first exemplified embodiment, a partial separation of the metallic connecting layer 4 is hereby effected, whereby the annular recesses 413 are exposed and the first regions 41 and the second regions 42 of the metallic connecting layer 4 are insulated from one another.

In a further exemplified embodiment (not additionally illustrated), the first metallic partial layer regions 411 have a different layer sequence than the second metallic partial layer regions 412. The first metallic partial layer regions 411 comprise a layer sequence that has the following individual layers (as seen from the growth substrate 29 in the following sequence): a layer of nickel (thickness between 2 µm and 3 µm), an oxidation layer of gold (thickness between 140 nm and 150 nm) arranged thereon, a layer of tin (thickness between 1.5 µm and 2.5 µm) arranged thereon, and, (optionally) arranged thereon, a layer of titanium and a layer of gold, as described in relation to the first exemplified embodiment. This layer sequence is arranged on side walls of the additional openings 61. Furthermore, the additional openings are lined with an insulating layer.

The second metallic partial layer regions 412 comprise a layer of titanium dioxide (that is also applied onto the base of the additional openings 61).

The second metallic partial layer 421 comprises a layer sequence that has the following individual layers (as seen from the support 5 in the following sequence): a layer of cobalt silicide as the contact between the metal and semiconductor (thickness, e.g., between 7.5 nm and 15 nm), a layer of titanium nitride as a depletion layer (thickness, e.g., between 70 nm and 80 nm) arranged thereon, a layer of titanium as an adhesion or wetting layer (thickness, e.g., between 120 nm and 130 nm) arranged thereon, a layer of tin (thickness between 1.3 µm and 1.7 µm) arranged thereon, on which an oxidation protective layer can optionally be arranged.

In the present exemplified embodiment, the growth substrate 29 consists of sapphire. A metallic connecting layer 4 is in turn produced by way of isothermal solidification at a temperature between 230° C. and 240° C. The system is kept at temperature until the tin has completely reacted with the nickel in the region of the first partial layer regions 411 and has thus constitutionally solidified. The solder system also flows in the liquid phase into the additional openings 61 and thereby stabilizes same. In contrast, in the region of the second metallic partial layer regions 412 and in the central regions of the additional openings 61, the tin is missing the required reaction partner and substantially remains as elemental tin that can be subsequently easily removed.

In the present exemplified embodiment, the support 5 consisting of silicon is thinned to a thickness between 170 µm and 180 µm. Now, recesses 9 having a diameter between 40 µm and 50 µm and additional recesses 93 having a width between 40 µm and 50 µm are etched in the support 5 in a dry-chemical and anisotropic manner until the process comes to a stop in regions consisting of cobalt silicide. Cobalt silicide, titanium nitride, titanium and tin are then etched in a wet-chemical manner whilst the inter-metallic connection $Ni_3Sn_4$ is not affected. As described above in relation to the first exemplified embodiment, the metallic connecting layer is hereby interrupted.

The subsequent method steps correspond to the method steps described above in relation to the first exemplified embodiment.

In a further exemplified embodiment (not additionally illustrated), the insulating layer 73 shown in FIG. 5 is not opened using a photolithographic process. Rather, by way of an isotropic (conformable) deposition of the insulating layer 73 and an anisotropic, e.g., dry-chemical, back-etching, the insulating layer is removed on the second major surface of the support 52 and on the base of the recesses 9 (in the region of the annular recesses), whilst the side walls of the recesses 9 and the annular recesses 413 remain coated. If the second major surface 52 of the support 5 has been previously coated with a material that is different from the insulating layer 73 but is likewise electrically insulating and is not affected, or is affected to a lesser degree, by the anisotropic etching process (e.g., $Si_3N_4$), the complete insulation of the support 5 is preserved.

The invention is not limited by the description made with reference to the exemplified embodiments. Rather, the invention includes any new feature and any new combination of features, including in particular any combination of features in the claims, even if this feature or this combination is not itself explicitly indicated in the claims or exemplified embodiments.

The invention claimed is:
1. A method for producing a plurality of optoelectronic semiconductor chips, the method comprising:
depositing, on a substrate, a semiconductor layer sequence having an active region provided for generating or receiving radiation, the active region being arranged between a first semiconductor layer and a second semiconductor layer;

forming a plurality of openings that extend through the second semiconductor layer and the active region and into the first semiconductor layer;

attaching the semiconductor layer sequence to a support by producing a metallic connecting layer that connects the semiconductor layer sequence and the support at least in regions;

removing parts of the metallic connecting layer thereby producing a plurality of first regions and a plurality of second regions electrically insulated from the first regions in the metallic connecting layer;

forming a plurality of recesses in the support;

after removing parts of the metallic connection layer, forming a plurality of first contacts and a plurality of second contacts, wherein each of the first contacts is connected to the first semiconductor layer in an electrically conductive manner via one of the first regions of the metallic connecting layer and through one of the openings, and each of the second contacts is connected to the second semiconductor layer in an electrically conductive manner via one of the second regions, electrically insulated from the first regions, of the metallic connecting layer, and wherein the first contacts are connected to the first regions in an electrically conductive manner through the recesses or the second contacts are connected to the second regions in an electrically conductive manner through the recesses; and singulating the support having the semiconductor layer sequence into a plurality of optoelectronic semiconductor chips, wherein each semiconductor chip comprises at least one opening, at least one recess, at least one first region and at least one second region.

2. The method according to claim 1, wherein, prior to attaching the semiconductor layer sequence to the support, the method further comprises forming a first metallic partial layer on a side of the semiconductor layer sequence facing away from the substrate and forming a second metallic partial layer on a first major surface of the support, and wherein, during the attaching, the metallic connecting layer is produced by virtue of the fact that the first metallic partial layer and the second metallic partial layer are, at least in regions, integrally bonded together.

3. The method according to claim 2, wherein the first metallic partial layer includes a plurality of first partial layer regions and a plurality of second partial layer regions electrically insulated from the first regions.

4. The method according to claim 2, wherein the first metallic partial layer and the second metallic partial layer are connected to each other by a soldering process.

5. The method according to claim 1, wherein forming the plurality of recesses comprises performing an etching process.

6. The method according to claim 1, wherein, prior to forming the first and second contacts, the method comprises applying an insulating layer that covers lateral surfaces of the recesses and at least partly covers a second major surface of the support facing away from the semiconductor layer sequence.

7. The method according to claim 1, further comprising thinning the support after attaching the semiconductor layer sequence and before forming the recesses in the support.

8. The method according to claim 1, further comprising removing the substrate.

9. An optoelectronic semiconductor chip comprising:
a semiconductor body that has a semiconductor layer sequence having an active region provided to generate or receive radiation, the active region arranged between a first semiconductor layer and a second semiconductor layer, the semiconductor layer sequence having an opening that extends through the second semiconductor layer and the active region and into the first semiconductor layer and that is at least partially filled with electrically conductive material;

a support that comprises a recess;

a metallic connecting layer between the semiconductor body and the support, wherein the metallic connecting layer comprises a first region and a second region electrically insulated from the first region, and wherein the first region is connected to the first semiconductor layer in an electrically conductive manner through the opening and the second region is connected to the second semiconductor layer in an electrically conductive manner; and a first contact and a second contact, wherein the first contact is connected to the first region in an electrically conductive manner through the recess or the second contact is connected to the second region in an electrically conductive manner through the recess, wherein an annular recess separates the first region from the second region, and wherein a diameter of the recess is smaller than an outer diameter of the annular recess.

10. The optoelectronic semiconductor chip according claim 9, wherein the first contact and the second contact are at least partially arranged on a second major surface of the support facing away from the semiconductor body.

11. The optoelectronic semiconductor chip according to claim 9, wherein the first contact is connected to the first region in an electrically conductive manner via the support or the second contact is connected to the second region in an electrically conductive manner via the support.

12. The optoelectronic semiconductor chip according to claim 9, wherein the support comprises a first recess and a second recess and the first contact is connected to the first region in an electrically conductive manner through the first recess and the second contact is connected to the second region in an electrically conductive manner through the second recess.

13. The optoelectronic semiconductor chip according to claim 9, wherein the support contains silicon.

14. The optoelectronic semiconductor chip according to claim 9, further comprising a reflective layer arranged between the support and the semiconductor body.

15. The optoelectronic semiconductor chip according to claim 9, further comprising an insulating layer that covers lateral surfaces of the recess and electrically insulates the first region and the second region of the metallic connecting layer from each other.

16. The optoelectronic semiconductor chip according to claim 9, further comprising an insulating layer that covers lateral surfaces of the recess and electrically insulates the first region and the second region of the metallic connecting layer from each other.

17. A method for producing a plurality of optoelectronic semiconductor chips, the method comprising:

depositing, on a growth substrate, a semiconductor layer sequence having an active region provided for generating or receiving radiation, the active region being arranged between a first semiconductor layer and a second semiconductor layer;

forming a plurality of openings that extend through the second semiconductor layer and the active region and into the first semiconductor layer;

attaching the semiconductor layer sequence to a support by producing a metallic connecting layer that connects the semiconductor layer sequence and the support at least in regions;

removing parts of the metallic connecting layer thereby producing a plurality of first regions and a plurality of second regions electrically insulated from the first regions in the metallic connecting layer;

forming a plurality of recesses in the support, after attaching the semiconductor layer sequence to the support;

after removing parts of the metallic connection layer, forming a plurality of first contacts and a plurality of second contacts, wherein each of the first contacts is connected to the first semiconductor layer in an electrically conductive manner via one of a plurality of first regions of the metallic connecting layer and through at least one of the openings, and each of the second contacts is connected to the second semiconductor layer in an electrically conductive manner via one of a plurality of second regions, electrically insulated from the first regions, of the metallic connecting layer, and wherein the first contacts are connected to the first regions in an electrically conductive manner through the recesses or the second contacts are connected to the second regions in an electrically conductive manner through the recesses; and singulating the support having the semiconductor layer sequence into the plurality of optoelectronic semiconductor chips, wherein each semiconductor chip comprises an opening, a recess, a first region and a second region.

\* \* \* \* \*